United States Patent
Sone et al.

(10) Patent No.: US 8,202,034 B2
(45) Date of Patent: Jun. 19, 2012

(54) VACUUM PROCESSING APPARATUS AND SUBSTRATE TRANSFER METHOD

(75) Inventors: Hiroshi Sone, Sagamihara (JP); Ryuji Higashisaka, Kawasaki (JP); Kazutoshi Yoshibayashi, Kawasaki (JP); Tatsunori Sato, Fuchu (JP); Tatsuhiro Takahashi, Hino (JP)

(73) Assignee: Canon Anelva Corporation, Kawasaki-shi (JP)

( * ) Notice: Subject to any disclaimer, the term of this patent is extended or adjusted under 35 U.S.C. 154(b) by 108 days.

(21) Appl. No.: 12/873,518

(22) Filed: Sep. 1, 2010

(65) Prior Publication Data
US 2011/0052349 A1    Mar. 3, 2011

(30) Foreign Application Priority Data

Sep. 2, 2009  (JP) ................................. 2009-202184
Aug. 9, 2010  (JP) ................................. 2010-178994

(51) Int. Cl.
*B65G 49/07*  (2006.01)

(52) U.S. Cl. ........... 414/226.01; 414/226.05; 414/744.6; 414/806; 414/941

(58) Field of Classification Search ............... 294/195; 414/222.09, 226.01, 226.05, 744.6, 938, 414/941, 806
See application file for complete search history.

(56) References Cited

U.S. PATENT DOCUMENTS

| | | | | |
|---|---|---|---|---|
| 4,664,578 A * | 5/1987 | Kakehi | ........................ | 414/217 |
| 4,681,505 A * | 7/1987 | Kobayashi et al. | ......... | 414/744.6 |
| 4,995,331 A * | 2/1991 | Voit | ................................ | 118/46 |
| 5,612,068 A * | 3/1997 | Kempf et al. | ................. | 425/574 |
| 5,846,328 A | 12/1998 | Aruga et al. | .................. | 118/718 |
| 6,158,951 A * | 12/2000 | Carr et al. | ................... | 414/749.4 |
| 6,319,373 B2 | 11/2001 | Takeyama et al. | ....... | 204/298.25 |
| 7,270,510 B2 * | 9/2007 | Putzi | ........................ | 414/226.05 |
| 7,918,488 B2 * | 4/2011 | Shiraishi et al. | ........... | 294/103.1 |
| 8,007,218 B2 * | 8/2011 | Park et al. | ..................... | 414/217 |
| 2007/0034479 A1* | 2/2007 | Todaka | ........................ | 198/463.1 |
| 2009/0308317 A1 | 12/2009 | Sone et al. | | |

FOREIGN PATENT DOCUMENTS

JP    8-274142    10/1996
JP    2001-210695    8/2001

* cited by examiner

*Primary Examiner* — James Keenan
(74) *Attorney, Agent, or Firm* — Fitzpatrick, Cella, Harper & Scinto

(57) ABSTRACT

A robot according to this invention includes a driving mechanism, a first arm rotatably connected to the driving mechanism, a second arm rotatably connected to the first arm, and an X-shaped end effector rotatably disposed at the distal end of the second arm. Of the four distal ends of the end effector, two distal ends include holding units which can hold substrates in one direction, and the remaining two distal ends include holding units which can hold substrates in the opposite direction.

6 Claims, 7 Drawing Sheets

VACUUM PROCESSING APPARATUS AND SUBSTRATE TRANSFER METHOD

BACKGROUND OF THE INVENTION

1. Field of the Invention

The present invention relates to a vacuum processing apparatus that includes a robot for use in substrate transfer, and a substrate transfer method and, more particularly, to a vacuum processing apparatus that includes a robot for use in substrate transfer in, for example, an in-line deposition apparatus which deposits a layer on a recording medium having a center hole, such as a magnetic disk or an optical disk, and a substrate transfer method using the robot.

2. Description of the Related Art

A robot has conventionally been employed to pick up substrates before a predetermined deposition process from a substrate storage unit and load them onto a carrier, or to unload the substrates having undergone the predetermined deposition process from the carrier and store them in a substrate storage unit.

A scalar robot is widely used as a robot which performs this operation. An example is a robot including a first arm and second arm whose driving is controlled via a driving unit body and a driving belt, and an adapter at the distal end of the second arm. This adapter is provided with end effectors which have various shapes and can hold substrates, and therefore can transfer the substrates (see, for example, Japanese Patent Laid-Open Nos. 8-274142 and 2001-210695).

An end effector of a robot described in Japanese Patent Laid-Open No. 8-274142 can transport two substrates at once, and sequentially load substrates onto a carrier which can mount two substrates. Also, an end effector of a robot described in Japanese Patent Laid-Open No. 2001-210695 uses an arched end effector to allow an operation of transporting two substrates at once and loading these substrates onto a carrier at once, thereby improving the throughput.

Unfortunately, in each of the robots disclosed in Japanese Patent Laid-Open Nos. 8-274142 and 2001-210695, substrate holding becomes unstable upon raising its operating speed in excess of a predetermined speed. Also, each of these robots inevitably requires more frequent maintenance with a rise in operating speed.

SUMMARY OF THE INVENTION

The present invention has been made in consideration of the above-mentioned problems, and has as its object to provide a vacuum processing apparatus and substrate transfer method which improve the rate at which substrates are loaded onto a carrier, or that at which the substrates are unloaded from the carrier while suppressing a rise in operating speed of a robot for use in substrate transfer, thereby improving the throughput.

According to one aspect of the present invention, there is provided a vacuum processing apparatus comprising a process chamber in which vacuum processing takes place, a substrate transfer chamber which is connected to the process chamber, and includes a substrate storage unit which stores a plurality of substrates, a substrate transport path which runs through the process chamber and the substrate transfer chamber, a plurality of carriers which are transported along the substrate transport path while each of the plurality of carriers mounts at least two substrates, and a substrate transfer robot which transfers the substrates stored in the substrate storage unit onto the carrier stopped at a substrate transfer position set to a predetermined position in the substrate transport path in the substrate transfer chamber, wherein the substrate transfer robot comprises
a driving shaft,
a first arm connected to the driving shaft,
a second arm rotatably connected to the first arm, and
an end effector rotatably disposed on the second arm, the end effector comprising a first holding group including not less than two holding units, each of which holds at least two substrates in one direction, and a second holding group including not less than two holding units, each of which holds at least two substrates in an opposite direction, and wherein the holding units of the second holding group face the substrate storage unit when the holding units of the first holding group are opposed to the carrier stopped at the substrate transfer position.

According to another aspect of the present invention, there is provided a substrate transfer method using the above-mentioned vacuum processing apparatus, comprising:

a first step of picking up four substrates from the substrate storage unit which stores substrates in advance, and holding two substrates in each of the holding units of the first holding group;

a second step of rotating the end effector so that the substrates held on the holding units of the first holding group face the carrier stopped at the substrate transfer position;

a third step of transferring one substrate held on each of the holding units of the first holding group onto the carrier stopped at the substrate transfer position, a fourth step of picking up four substrates from the substrate storage unit, and holding two substrates on each of the holding units of the second holding group;

a fifth step of transporting the carrier, onto which the substrates are transferred, into a process chamber in which vacuum processing takes place, and stopping a second carrier which mounts no substrates at the substrate transfer position; and a sixth step of rotating the end effector so that the holding units of the first holding group face the substrate storage unit, after the remaining one substrate held on each of the holding units of the first holding group is transferred onto the second carrier.

According to the present invention, it is possible to improve the productivity without raising the robot speed. It is also possible to reduce the number of times of robot operation during substrate transportation, thereby prolonging the life of an industrial robot.

Further features of the present invention will become apparent from the following description of exemplary embodiments with reference to the attached drawings.

DESCRIPTION OF THE EMBODIMENTS

An embodiment of the present invention will be described below with reference to the accompanying drawings. Note that members, arrangements, and other features to be described hereinafter are merely examples which embody the present invention, and do not limit the present invention, so various changes can be made within the scope of the present invention, as a matter of course.

Figure 1:
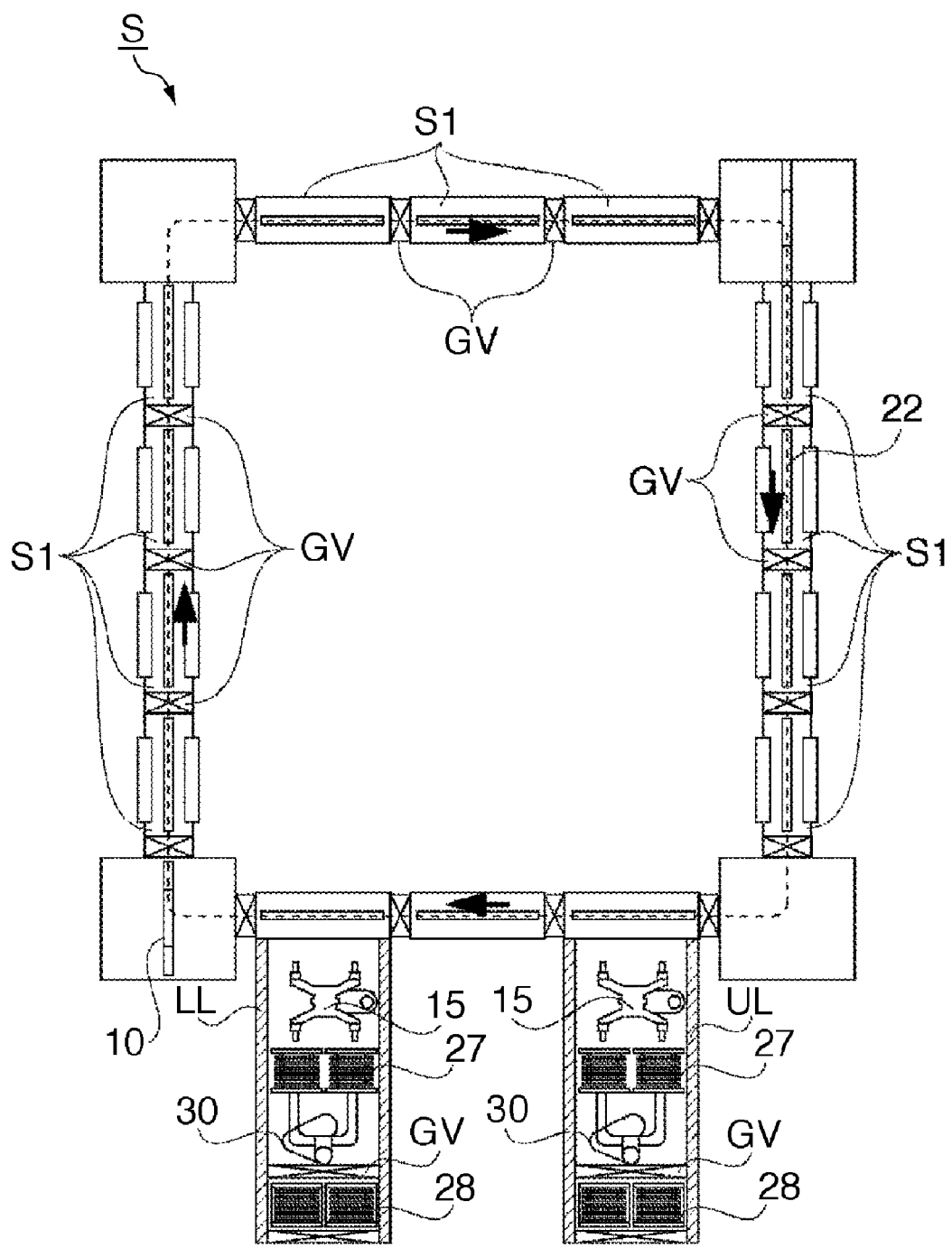
FIG. 1 is a schematic view showing a vacuum processing apparatus according to an embodiment of the present invention.
Figure 2:
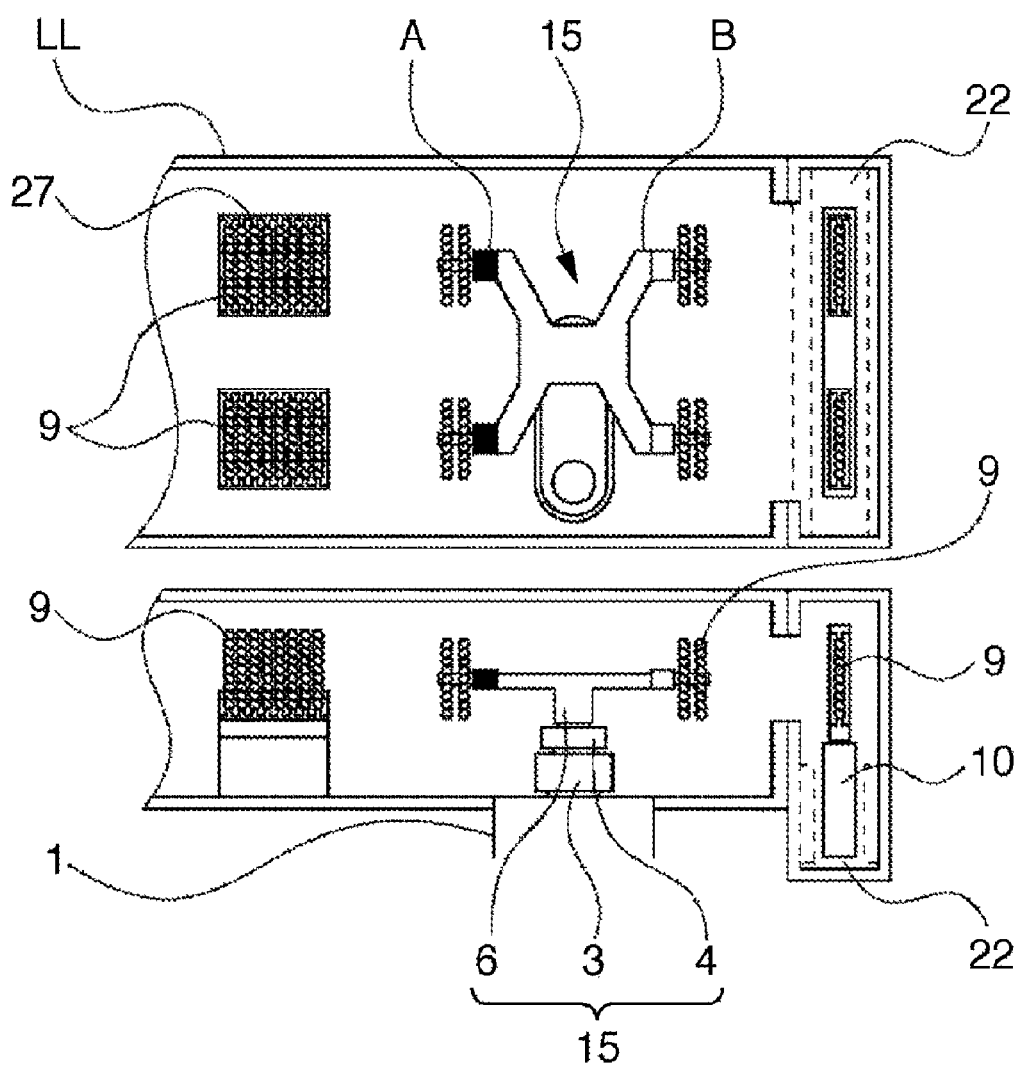
FIG. 2 shows a partial plan view and partial side view of a load chamber according to the embodiment of the present invention.
Figure 3:
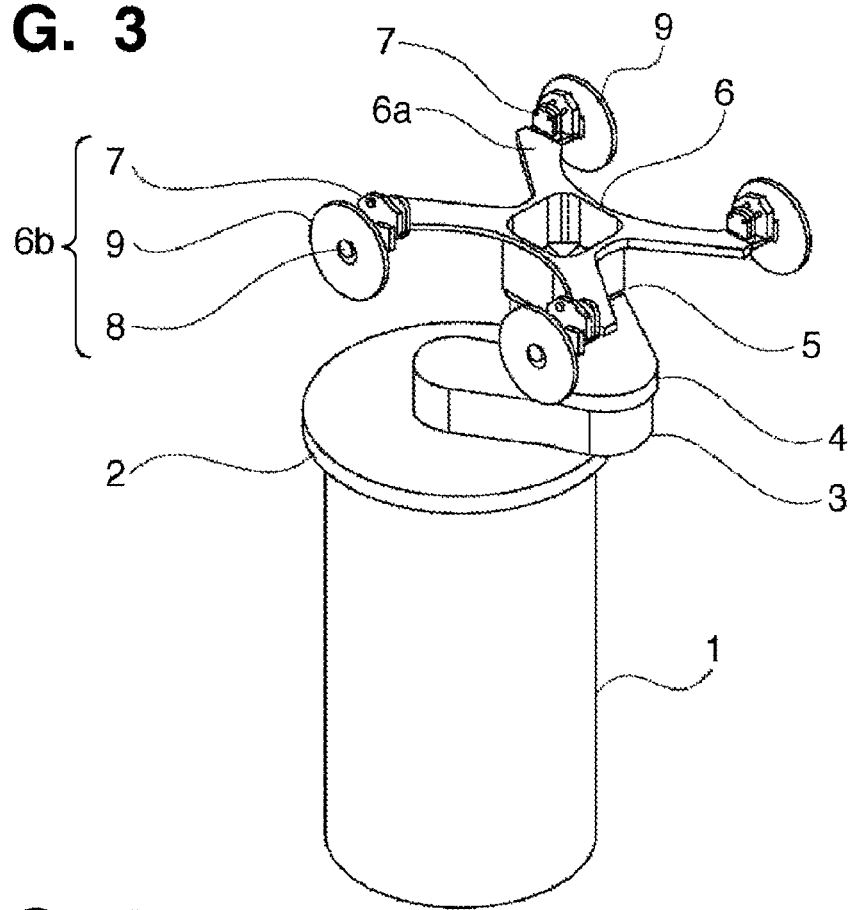
FIG. 3 is a schematic view showing a robot according to the embodiment of the present invention.
Figure 4:
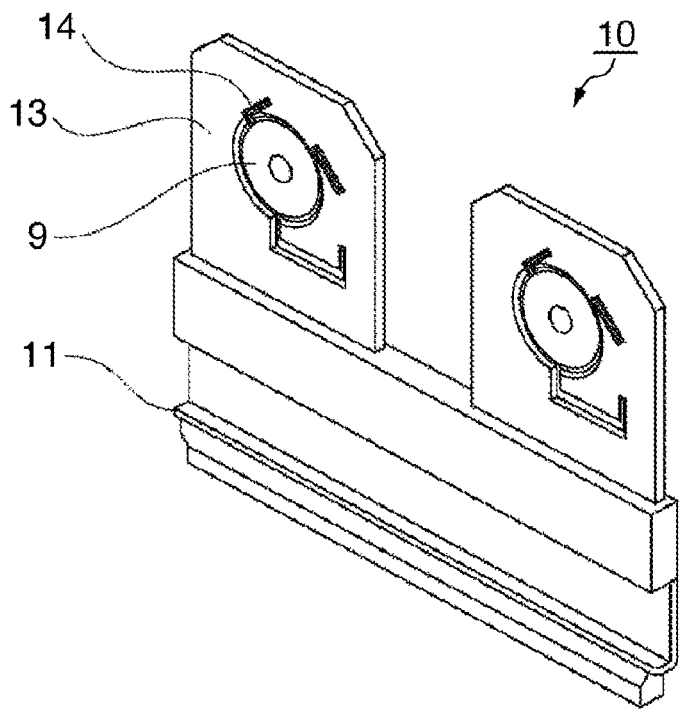
FIG. 4 is a schematic view showing a carrier according to the embodiment of the present invention.

FIGS. 1 to 6A to 6F are views for explaining a vacuum processing apparatus and a substrate transport robot (to be simply referred to as a robot hereinafter) according to an embodiment of the present invention, in which FIG. 1 is a schematic view showing the vacuum processing apparatus; FIG. 2 shows a plan view and side view of a load chamber; FIG. 3 is a schematic view showing the robot; FIG. 4 is a schematic view showing a carrier; and FIGS. 5A to 5F and 6A to 6F are views for explaining a robot operation. Note that some parts are not illustrated in FIGS. 1 to 6A to 6F for the sake of drawing simplicity.

A vacuum processing apparatus S shown in FIG. 1 is an in-line sputtering deposition apparatus, and is connected to a plurality of chambers, which function as a load chamber LL, an unload chamber UL, deposition chambers S1, and other process chambers, via gate valves GV in a quadrangular pattern. Substrates 9 are charged into the load chamber LL while being mounted in a substrate cassette 28, and are transferred into a substrate storage unit 27 by an inter-cassette transfer robot 30. The substrates 9 are further transferred onto a carrier 10 (to be described later) by a robot 15, are transported along a substrate transport path 22 which runs through the chambers, while being mounted on the carrier 10, and undergo a predetermined process in each chamber.

The substrates 9 in this embodiment preferably are disk-like members used for storage media such as magnetic disks or optical disks. However, glass substrates, metal substrates made of, for example, aluminum or an aluminum alloy, silicon substrates, or resin substrates, with various shapes, can also be used by exchanging a substrate holder 13 attached to the carrier 10. Note that the load chamber LL and unload chamber UL will be collectively referred to as a substrate transfer chamber hereinafter.

The robot 15 according to the present invention is widely applicable to a sputtering deposition apparatus and apparatuses for use in thin film formation using, for example, an electron beam, surface modification, and vacuum processing such as dry etching. However, an example in which the robot 15 is applied to an in-line sputtering deposition apparatus (vacuum processing apparatus S) will be explained in this embodiment.

FIG. 2 shows a plan view and side view of the load chamber LL in the embodiment of the present invention. The robot 15 is at the position between the substrate transport path 22 in the load chamber LL and the substrate storage unit 27. The carrier 10 is a member which moves along the substrate transport path 22 while mounting the substrates 9, and is controlled to stop at a predetermined position (substrate transfer position) in the load chamber LL during an operation of transferring the substrates 9. The substrate storage unit 27 which separately stores substrates 9 before deposition is provided in the load chamber LL. The substrates 9 stored in the substrate storage unit 27 are transferred onto the carrier 10 by the operation of the robot 15 provided in the load chamber LL.

The unload chamber UL has nearly the same arrangement as the load chamber LL. That is, the processed substrates 9 mounted on the carrier 10 are stored in a substrate storage unit 27 by the operation of a robot 15 provided in the unload chamber UL, are loaded into a substrate cassette 28 by an inter-cassette transfer robot 30, and are unloaded from the unload chamber UL, together with the substrate cassette 28. The substrate storage unit 27 can store 25 substrates 9 aligned each in two lines, and the substrate cassette 28 can store 25 or 50 substrates 9 aligned each in two lines.

The carrier 10, an end effector 6, and the substrate storage unit 27 are arranged such that the transport paths of the substrates 9 on the left and right sides and on the upper and lower sides are identical to each other, and have a positional relationship in which the substrates 9 can be transferred by a shortest distance in a minimum number of steps.

FIG. 3 is a schematic view showing a robot including an end effector according to the present invention. The robot used in this embodiment is a scalar robot including a robot body 1 which serves as a driving mechanism and is provided with a first arm 3 including a driving belt which transmits a rotational force from the driving mechanism, and a second arm 4 having the same mechanism as the first arm 3. The robot body 1 includes a driving source (driving shaft) for rotation, a driving source (vertical moving means) for vertical movement, and a connecting flange 2 provided in the chamber. The second arm 4 is provided with an adapter 5 for connecting the second arm 4 to the end effector 6.

The driving force of the robot body 1 is transmitted to the end effector 6 via the driving shaft, first arm 3, and second arm 4. Rectilinear movement and rotational movement of the end effector 6 attached to the second arm 4 can be performed by controlling the angles of the first arm 3 and second arm 4. Also, the end effector 6 can be vertically moved relative to the connecting flange 2 by the vertical moving mechanism of the robot body 1. More specifically, the first arm 3 can vertically move, and the second arm 4, end effector 6, and other members mounted on the first arm 3 can vertically move with the movement of the first arm 3. Note that the end effector 6 can rotate about the second arm 4.

The end effector 6 is formed by attaching a locking mechanism 6b which holds the substrates 9 to the end position of a support member 6a connected to the adapter 5. The locking mechanism 6b mainly includes picks 8 (holding units) for mounting the substrates 9, and pick connecting blocks 7 which connect the picks 8 to the end effector 6.

More specifically, the end effector 6 is formed by connecting four sets each of a pick connecting block 7 and a pick 8 to the distal ends of portions, in the roughly X-shaped support member 6a, extending in four directions from the center of the support member 6a. Two locking portions including, for example, grooves are formed in each pick 8 with a predetermined interval between them in order to hold two substrates 9 at once. That is, the end effector 6 can hold a maximum total of eight substrates 9. Also, two out of the four picks 8 connected to the support member 6a are attached such that they can hold the substrates 9 in one direction, and the remaining two picks 8 are attached such that they can hold the substrates 9 in the opposite direction. Note that the support member 6a may have any shape as long as it can hold substrates in opposite directions, and may have, for example, an H shape. Also, a maximum of three or more substrates 9 can be held on each pick 8.

FIG. 4 is a schematic view showing the carrier 10. The carrier 10 is formed by connecting substrate holders 13, each of which are provided with substrate support grippers 14 for supporting the substrate 9, onto a slider 11 having a mechanism for moving the slider 11 between the deposition chambers. The substrate support gripper 14 is an elastic member, and includes a bent leaf spring. Since the carrier 10 used in this embodiment includes the two substrate holders 13, it can mount two substrates 9 at once. Note that the shape of the carrier 10 changes in accordance with the type of mechanism which transports substrates between the deposition chambers, and the substrate support grippers 14 for supporting the substrates 9 can also be changed as needed. Two substrate support grippers 14 are provided on the upper side of the substrate holder 13, and one substrate support gripper 14 is provided on its lower side. Thus, substrate holding can be canceled by pushing down the lower substrate support gripper 14. The number and arrangement of substrate support grippers 14 can be changed as needed, as a matter of course.

An operation of transferring the substrates 9 by the robot 15 will be described herein with reference to FIGS. 5A to 5F and 6A to 6F. Note that in the description related to FIGS. 5A to 5F and 6A to 6F, a part provided with two picks 8 on one side is defined as arm A (one side of the end effector 6), and that provided with two picks 8 on the opposite side is defined as arm B (the other side of the end effector 6). Note also that the group of picks 8 provided on arm A is defined as a first pick group (first holding group), and the group of picks 8 provided on arm B is defined as a second pick group (second holding group).

Figure 5A:
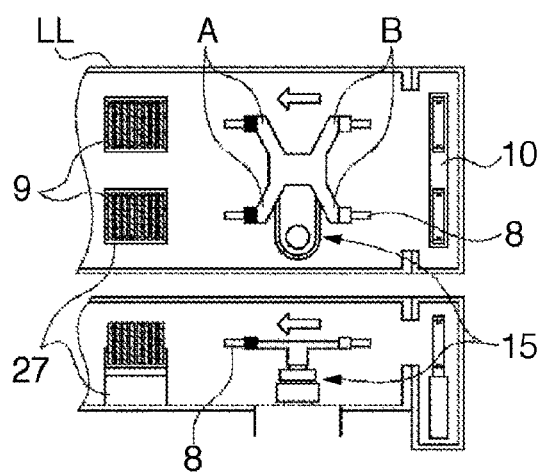
FIGS. 5A to 5F are views for explaining a robot operation according to the embodiment of the present invention.

FIG. 5A shows a plan view and side view in the load chamber LL when the robot 15 is in the initial state. At this time, no substrates are held on the four picks 8 of the end effector 6, substrates 9 before deposition are stored in the substrate storage unit 27, and substrates 9 have not yet been loaded onto the carrier 10.

Figure 5B:
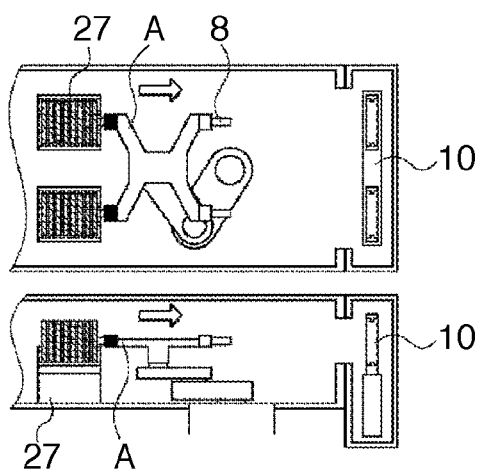

An operation of picking up four substrates 9 from the substrate storage unit 27 and placing them on the two picks 8 (first pick group) by arm A of the end effector 6 is performed next, as shown in FIG. 5B. The end effector 6 moves toward the substrate storage unit 27 by the operations of the first arm 3 and second arm 4 to insert the picks 8 into the center holes in substrates 9. In this state, the substrates 9 are lifted together with the end effector 6 by the vertical moving mechanism of the robot body 1, thereby being held on the picks 8. Since the substrates 9 are stored in the substrate storage unit 27 in accordance with the interval between the two substrate locking portions in each pick 8, the pick 8 can hold two substrates 9 at once.

Figure 5C:
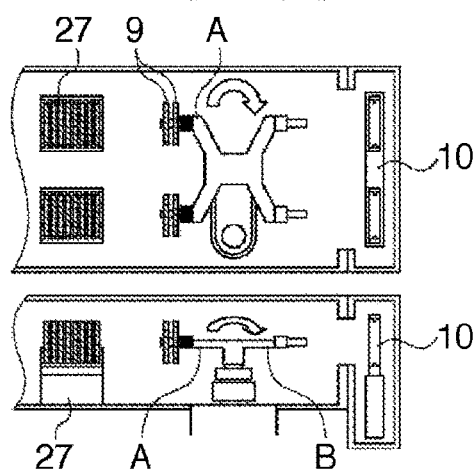
Figure 5D:
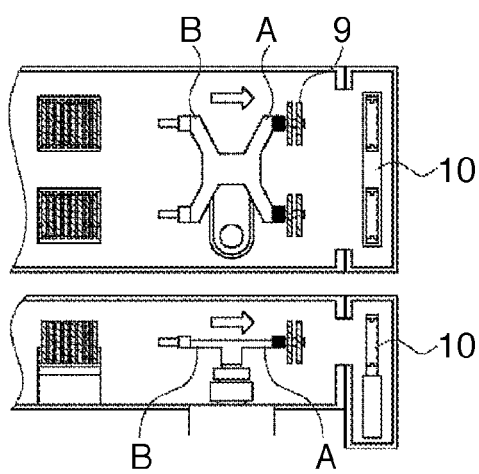

FIG. 5C shows the state in which the four substrates 9 are mounted on the picks 8 (first pick group) of arm A. Subsequently, the end effector 6 is rotated through 180° to direct arm A toward the carrier 10, as shown in FIG. 5D.

Figure 5E:
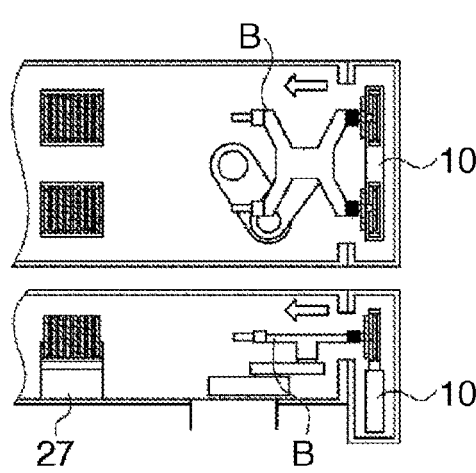

Referring to FIG. 5E, an operation of moving arm A to the carrier 10 by the end effector 6 to load the two substrates 9 locked in the picks 8 onto the carrier 10 stopped at the substrate transfer position is performed. At this time, the lower substrate support gripper 14 on the substrate holder 13 of the carrier 10 is pushed down to move the substrates 9 locked in the picks 8 to the substrate holding positions of the substrate holder 13. The two substrates 9 held on the picks 8 of arm A are lifted by the vertical moving mechanism of the robot body 1 until they come into contact with the upper substrate support grippers 14 of the carrier 10. After that, the lower substrate support gripper 14 is returned to the initial position. This makes it possible to smoothly transfer the substrates 9 onto the carrier 10.

The position of the end effector 6 in the vertical direction (the direction of gravity), where the substrates 9 are brought into contact with the upper substrate support grippers 14 of the carrier 10, is defined as an upper limit position, and that of the end effector 6, where the substrates 9 are moved to the substrate holding positions of the substrate holder 13 with the lower substrate support grippers 14 being pushed down, is defined as a lower limit position. The level position of the end effector 6 is controlled in two steps based on the upper and lower limit positions. Note that vertical movement of the end effector 6 during the operation of holding the substrates 9 is also controlled in two steps based on the upper and lower limit positions.

Figure 5F:
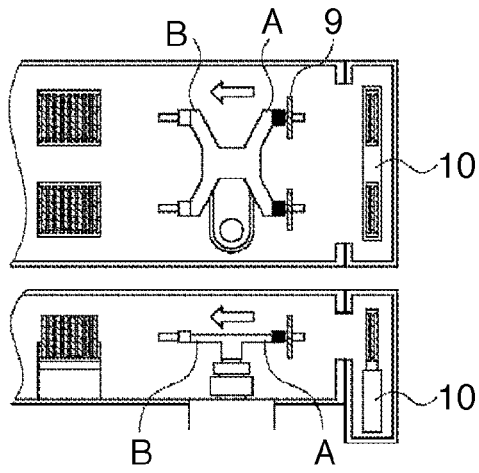

Referring to FIG. 5F, the end effector 6 returns to the standby position while the two substrates 9 are mounted on the picks 8 of arm A. At this time, the two substrates 9 are locked in the picks 8 of arm A. Note that in this embodiment, the substrates 9 held on the carrier 10 are at the same level as the substrates 9 stored in the substrate storage unit 27. Hence, the end effector 6 need only vertically move only during the operation of holding the substrates 9. This makes it possible to minimize the amount of movement in the vertical direction. In this way, the substrates 9 can be smoothly transferred onto the carrier 10. Note that the substrates 9 held in the substrate storage unit 27 and carrier 10 may be at different levels, as a matter of course. Note also that the end effector 6 preferably can simultaneously rotate and vertically move.

Figure 6A:
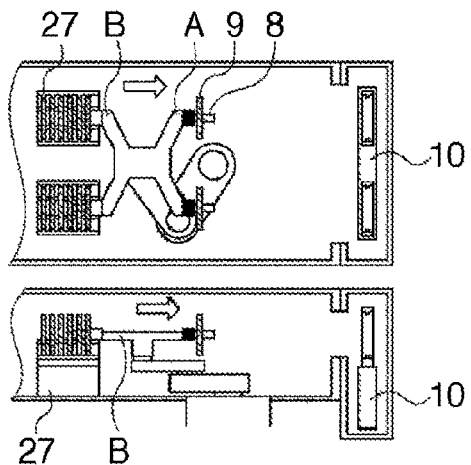
FIGS. 6A to 6F are views for explaining the robot operation according to the embodiment of the present invention.

Referring to FIG. 6A, an operation of retracting the end effector 6, while the two substrates 9 are mounted on the picks 8 of arm A, to pick up four substrates 9 from the substrate storage unit 27 and place them on the picks 8 of arm B is performed. More specifically, while the two substrates 9 are mounted on the picks 8 of arm A (one substrate 9 is mounted on each pick), arm B is moved to the substrate storage unit 27 by the operations of the first arm 3 and second arm 4 to insert the picks 8 into the center holes in the substrates 9. The first arm 3 is lifted by the vertical moving means of the robot body 1 to pick up four substrates 9 from the substrate storage unit 27 and place them in the picks 8 of arm B.

After that, the end effector 6 moves to an arbitrary home position such as the standby position by the operations of the first arm 3 and second arm 4. At this time, referring to FIG. 5E, the carrier 10 (first carrier) onto which the substrates 9 are transferred is transported into the process chambers, and the next carrier 10 (second carrier) which mounts no substrates 9 is transported into the load chamber LL.

Figure 6B:
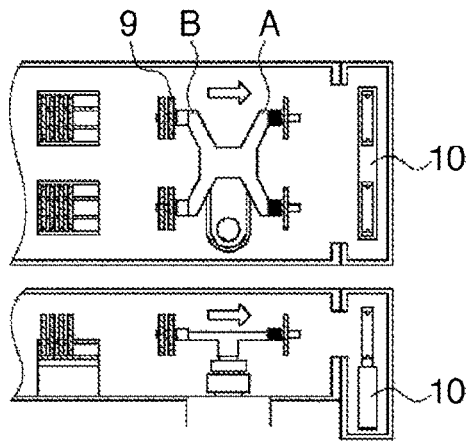
Figure 6C:
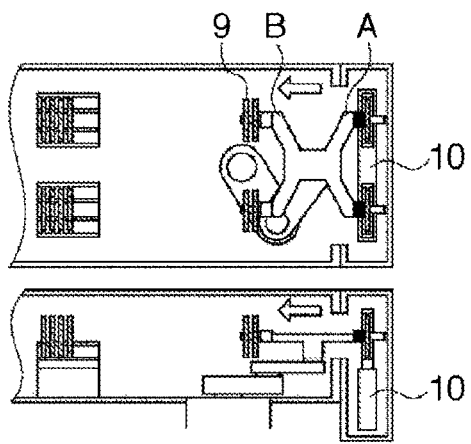

FIG. 6B shows the state in which the two substrates 9 are mounted on the picks 8 (first pick group) of arm A, and the four substrates 9 are mounted on the picks 8 (second pick group) of arm B. Subsequently, arm A is extended to the carrier 10 (second carrier) to load the remaining two substrates 9 mounted on the picks 8 of arm A onto the carrier 10 (second carrier), as shown in FIG. 6C.

Figure 6D:
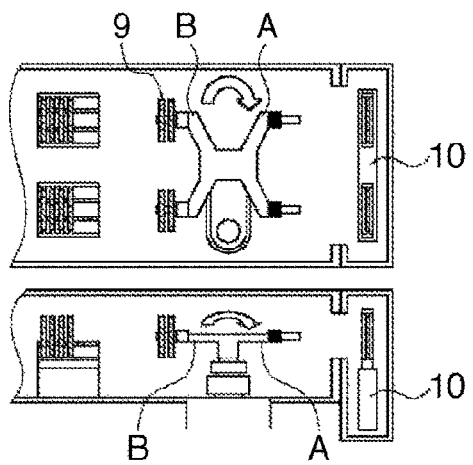

FIG. 6D shows the state in which no substrates 9 are mounted on the picks 8 of arm A as all the substrates 9 are transferred onto the carrier 10 (second carrier), and the four substrates 9 are mounted on the picks 8 of arm B. In this state, the end effector 6 is returned to the standby position.

Figure 6E:
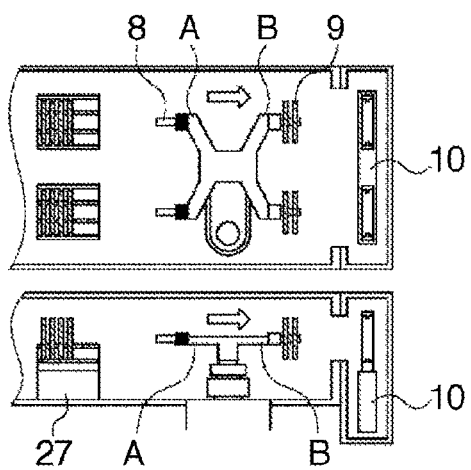
Figure 6F:
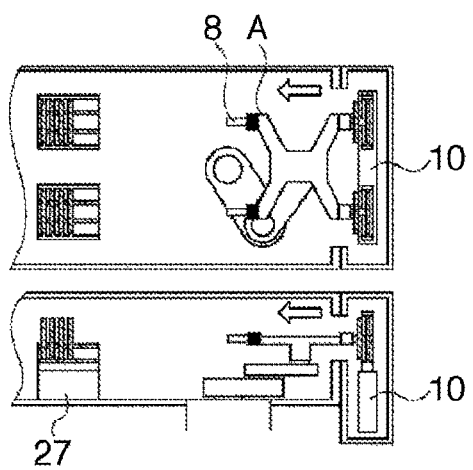

FIG. 6E shows the state in which arm B is directed toward the carrier 10 by rotating the end effector 6 through 180°. At the same time, the carrier 10 (second carrier) which mounts the substrates 9 is transported into the deposition chamber, and the next carrier 10 which mounts no substrates 9 is transported into the load chamber LL. After that, the operation from the state shown in FIG. 5E is repeated while arms A and B remain at the current positions in the end effector 6, as shown in FIG. 6F.

The unload chamber UL can have an arrangement similar to the load chamber LL. In the unload chamber UL, the robot 15 performs an almost opposite operation to that in the load chamber LL.

In the operation of the robot 15 using the X-shaped end effector 6 mentioned above, a substrate transfer operation can be performed by repeating rotating of the end effector 6 through 180° in the process of transporting the substrates 9 from the substrate storage unit 27 onto the carrier 10. That is, since the end effector 6 can be rotated through 180° instead of 360° like the conventional case, the transfer rate of the substrates 9 can be improved without raising the operating speed of the robot 15. Moreover, the use of the picks 8, each of which can mount two substrates 9, allows two operations in different steps: an operation of picking up substrates 9 from the substrate storage unit 27 and placing them on the picks 8, and an operation of rotating the end effector 6 to a position where a substrate transfer operation is possible.

That is, in the conventional case the substrates 9 are transferred onto the carrier 10 once in three operations: "180° Rotation"→"Substrate Holding"→"180° Rotation", but in this embodiment the substrates 9 can be transferred onto the carrier 10 once in two operations: "Substrate Holding" and "180° Rotation". More specifically, at the timing from when the first substrate 9 held on the first pick group is transferred onto the carrier 10 until the second substrate 9 on the first pick group is transferred onto the carrier 10 (second carrier), an operation of picking up substrates 9 from the substrate storage unit 27 and holding them on the picks 8 (second pick group) on the opposite side is performed. This operation makes it possible to greatly improve the transfer rate of the substrates 9 without raising the operating speed of the robot 15.

An operation then picks 8, each of which can hold three substrates 9 at once, are used will be described herein. A case in which only two substrates are held on each pick 8 of the end effector 6 will be explained first. If an odd number of substrates 9 are stored in the substrate storage unit 27, an operation of holding only one substrate on each pick is performed for the substrates 9 stored in the last line.

If the substrate storage unit 27 can store substrates in, for example, 25 lines, each pick 8 receives two substrates from the substrate storage unit 27 until the number of times of reception reaches 12. However, each pick 8 receives only the remaining one substrate on the 13th time. As a result, the operation shown in FIGS. 5A to 5F can be repeated 12 times, but only on the 13th time the end effector 6 is inverted while one substrate 9 is mounted on each pick 8 on one side. If no measure is taken, it takes much time to transfer the substrates 9 onto the carrier 10 only on the 13th time, so the throughput temporarily lowers.

A case in which each pick 8 can hold three substrates 9 at once will be explained. In this case, when a substrate storage unit 27 which can store substrates in 25 lines is used, the substrates 9 are transferred by repeating the operation shown in FIGS. 5A to 5F, in which each pick 8 receives two substrates 9 from the substrate storage unit 27, until the number of times of repetition reaches 11. Only on the 12th time each pick 8 can be set to receive three substrates 9 at once.

Since the number of times of reception from the substrate storage unit 27 decreases by one, it is possible to save the time taken to transfer the substrates 9 onto the carrier 10, thus improving the throughput. Note that a transfer method in a substrate locking mechanism which can hold three substrates 9 is not limited to the above-mentioned method, and each pick 8 may always receive two or more substrates 9 from the substrate storage unit 27. The number of substrates 9 which can be held at once is not limited to three, either. Furthermore, although each pick 8 receives three substrates 9 from the substrate storage unit 27 on the 12th time in this embodiment, this timing may be the first time or another time.

Figure 7:
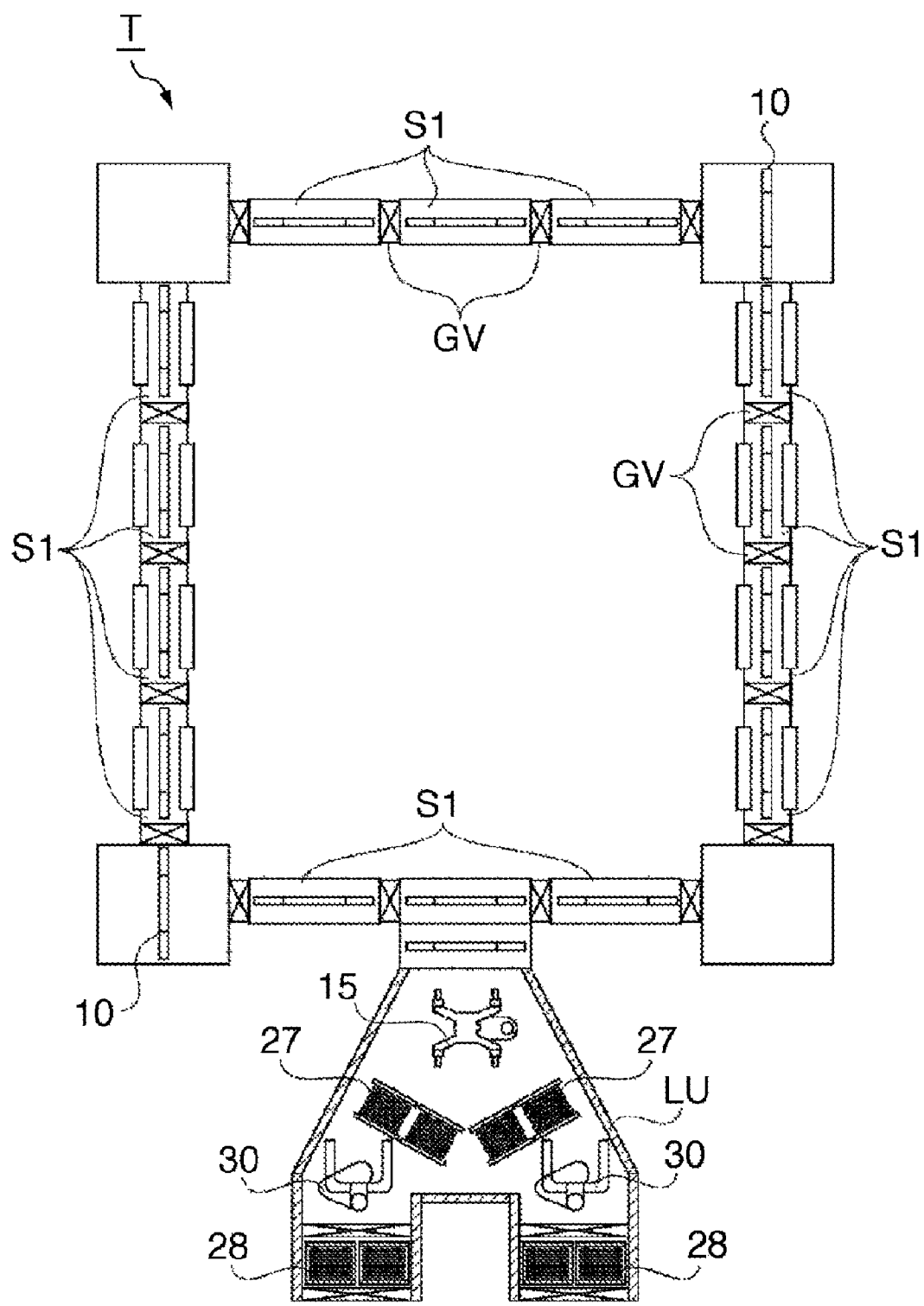
FIG. 7 is a schematic view showing an example in which the robot according to the embodiment of the present invention is built in another vacuum processing apparatus.
Figure 8A:
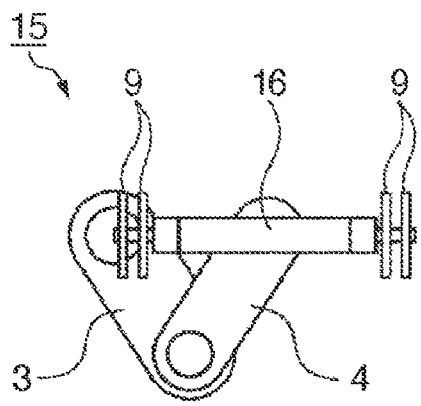
FIGS. 8A to 8D are schematic views showing end effectors according to other embodiments of the present invention.
Figure 8B:
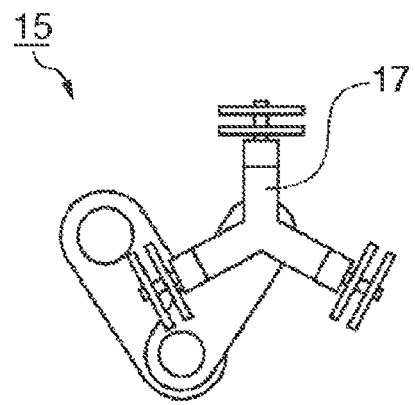
Figure 8C:
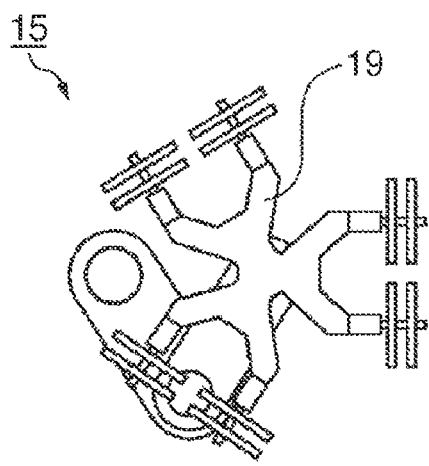
Figure 8D:
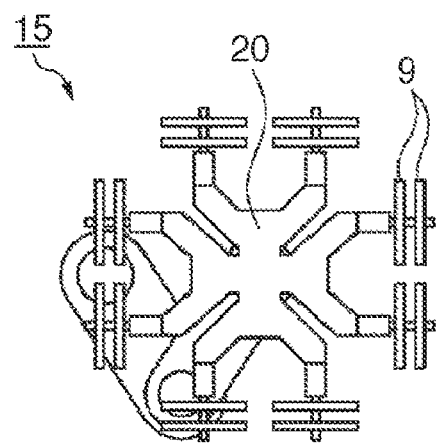

FIG. 7 shows an example in which the robot is built in another vacuum processing apparatus. A vacuum processing apparatus T shown in FIG. 7 is greatly different from the vacuum processing apparatus S shown in FIG. 1 in that in the former the load chamber LL and unload chamber UL are integrally formed as a transfer chamber LU. Note that the same reference numerals as in the vacuum processing apparatus S denote the same members, arrangements, and other features in the vacuum processing apparatus T shown in FIG. 7, and a detailed description thereof will not be given.

The transfer chamber LU is formed by integrally connecting the internal spaces of the load chamber LL and unload chamber UL of the vacuum processing apparatus S on the side of the substrate transport path 22. A single robot 15 is disposed on the side of the substrate transport path 22 in the transfer chamber LU. In the transfer chamber LU, the single robot 15 performs both unloading of processed substrates 9 from the carrier 10, and loading of unprocessed substrates 9 onto the carrier 10.

The robot 15 includes an X-shaped end effector 6, and uses arm A for substrate loading, and arm B for substrate unloading. Two substrate storage units 27 are provided so that one is used to store unprocessed substrates to be loaded, and the other one is used to store unloaded substrates 9 (substrates 9 after deposition), thereby integrating load chamber LL and unload chamber UL into one chamber (transfer chamber LU). This allows the single robot 15 to perform both loading and unloading of the substrates 9.

The robot 15 operates to unload the substrates 9 after deposition from the carrier 10 using arm B, and to load the substrates 9 before deposition, which have already been mounted on arm A, onto the carrier 10. The carrier 10 (first carrier) is transported, and while the next carrier 10 (second carrier) moves to the substrate unloading/loading position, the substrates 9 on arm B are transported into the substrate storage unit 27 for substrate unloading. After that, the substrates 9 before deposition are picked up from the substrate storage unit 27 which stores unprocessed substrates 9, and are placed on arm A. The same cycle is performed for the next carrier 10.

Although an example in which one substrate 9 is mounted on each pick 8 of each of arms A and B has been described above, two substrates 9 can also be mounted on each pick 8. This obviates the need for operations of storing and loading substrates 9 into the substrate storage unit 27 for each carrier. That is, one of the storing and loading operations can be performed for each carrier. This makes it possible to reduce the amount of operation of the robot 15 without slowing down the transfer rate of the substrates 9.

FIGS. 8A to 8D are schematic views showing end effectors according to other embodiments. In the robot 15 including the end effector 6 shown in FIG. 3, the end effector attached to the adapter 5 can be changed. Conceivable examples of substitute end effectors are an end effector 16 (FIG. 8A) to which two picks 8 can be connected, an end effector 17 (FIG. 8B) to which three picks 8 can be connected, an end effector 19 (FIG. 8C) to which six picks 8 can be connected, and an end effector 20 (FIG. 8D) to which eight picks 8 can be connected.

A support member of each of the end effectors 16, 17, 19, and 20 have portions extending in the directions of the connecting flange 2, first arm 3, and second arm 4 at equal angular intervals from the center. Also, the picks 8 of each of the end effectors 16, 17, 19, and 20 can be held such that the deposition surfaces of the substrates 9 face in the directions of the connecting flange 2, first arm 3, and second arm 4 at equal angular intervals from the center. The end effectors 19 and 20 are especially advantageous in this respect because they bifurcate in the middle of the portions extending in the respective directions (at the distal ends of the extending portions), so portions closer to the distal ends than the bifurcated portions extend parallel to the directions of extension before bifurcation.

To transfer the substrates 9 onto the carrier 10 using robots including the end effectors 16, 17, 19, and 20, the substrates 9 are transferred onto the carrier 10 using the picks 8 on one side, and are placed on the picks 8 on the other side by rotating the end effectors 16, 17, 19, and 20 through a predetermined angle. This makes it possible to adopt almost the same substrate transfer method as in the robot including the end effector 6.

The end effectors 16, 17, 19, and 20 shown in FIGS. 8A to 8D are merely examples, and end effectors to which the picks 8 can be connected in the vertical direction can also be adopted, as a matter of course. Furthermore, the support member and the picks 8 of each of the end effectors 16, 17, 19, and 20 need not always be arranged at equal angular intervals, and may be shifted at a predetermined angle.

The robot 15 according to the present invention is not limited to use for transportation and is widely applicable to various industrial robots. The same structure can also be used for, for example, welding robots. By disposing a single robot across two lines, this robot can replace two conventional industrial robots.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-202184 filed Sep. 2, 2009, Japanese Patent Application No. 2010-178994 filed Aug. 9, 2010, which are hereby incorporated by reference herein in their entirety.

What is claimed is:

1. A vacuum processing apparatus comprising
    a process chamber in which vacuum processing takes place,
    a substrate transfer chamber which is connected to the process chamber, and includes a substrate storage unit which stores a plurality of substrates,
    a substrate transport path which runs through the process chamber and the substrate transfer chamber,
    a plurality of carriers which are transported along the substrate transport path while each of the plurality of carriers mounts at least two substrates, and
    a substrate transfer robot which transfers the substrates stored in the substrate storage unit onto one of the plurality of carriers stopped at a substrate transfer position set to a predetermined position in the substrate transport path in the substrate transfer chamber,
    wherein the substrate transfer robot comprises
        a driving shaft,
        a first arm connected to said driving shaft,
        a second arm rotatably connected to said first arm, and
        an end effector rotatably disposed on said second arm,
        said end effector comprising a first holding group including not less than two holding units, each of which holds at least two substrates in one direction, and a second holding group including not less than two holding units, each of which holds at least two substrates in an opposite direction, and
    wherein said holding units of said second holding group face the substrate storage unit when said holding units of said first holding group are opposed to the carrier stopped at the substrate transfer position.

2. The apparatus according to claim 1, wherein each of said first holding group and said second holding group includes two holding units, each of which can hold two substrates at once.

3. The apparatus according to claim 1, wherein the substrate transfer robot further comprises vertical moving means for controlling a position of said end effector in a direction of gravity in two steps based on a position to which said end effector is lowered, and a position to which said end effector is lifted.

4. A substrate transfer method using the vacuum processing apparatus defined in claim 1, comprising:
    a first step of picking up four substrates from the substrate storage unit which stores substrates, and holding two substrates in each of the holding units of the first holding group;
    a second step of rotating the end effector so that the substrates held on the holding units of the first holding group face the carrier stopped at the substrate transfer position;
    a third step of transferring one substrate held on each of the holding units of the first holding group onto the carrier stopped at the substrate transfer position,
    a fourth step of picking up four substrates from the substrate storage unit, and holding two substrates on each of the holding units of the second holding group;
    a fifth step of transporting the carrier, onto which the substrates are transferred, into a process chamber in which vacuum processing takes place, and stopping a second carrier which mounts no substrates at the substrate transfer position; and
    a sixth step of rotating the end effector so that the holding units of the first holding group face the substrate storage unit, after the remaining one substrate held on each of the holding units of the first holding group is transferred onto the second carrier.

5. The method according to claim 4, wherein the fourth step and the fifth step are performed in parallel.

6. The method according to claim 5, wherein if the substrate storage unit stores an odd number of lines of substrates, an odd number of substrates are held on each of the holding units in only an arbitrary one of operations of performing the first step and the fourth step, in which the substrates are picked up from the substrate storage unit and held on the holding units.

* * * * *